(12) United States Patent
Fu et al.

(10) Patent No.: US 7,807,568 B2
(45) Date of Patent: Oct. 5, 2010

(54) METHODS FOR REDUCING DAMAGE TO SUBSTRATE LAYERS IN DEPOSITION PROCESSES

(75) Inventors: Xinyu Fu, Fremont, CA (US); Arvind Sundarrajan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/257,143

(22) Filed: Oct. 23, 2008

(65) Prior Publication Data
US 2010/0105203 A1 Apr. 29, 2010

(51) Int. Cl.
*H01L 21/4763* (2006.01)
(52) U.S. Cl. ........................ 438/643; 438/644; 438/653; 438/680; 438/687; 257/751; 257/753; 257/E21.169; 257/E21.577; 257/E21.585
(58) Field of Classification Search ................. 438/643, 438/644, 653, 680, 687, 637; 257/751, 753, 257/762, 774, E21.169, E21.577, E21.585
See application file for complete search history.

(56) References Cited

U.S. PATENT DOCUMENTS

| | | | |
|---|---|---|---|
| 6,258,710 B1 | 7/2001 | Rathore et al. | |
| 6,284,652 B1 | 9/2001 | Charneski et al. | |
| 6,566,259 B1 | 5/2003 | Ding et al. | |
| 2004/0140196 A1* | 7/2004 | Gopalraja et al. | ...... 204/192.12 |
| 2005/0023686 A1* | 2/2005 | Lin | .............. 257/751 |
| 2007/0059502 A1 | 3/2007 | Wang et al. | |
| 2007/0095654 A1* | 5/2007 | Gopalraja et al. | ...... 204/192.15 |

OTHER PUBLICATIONS

International Search Report and Written Opinion mailed May 28, 2010 for PCT Application No. PCT/US2009/061601.

\* cited by examiner

*Primary Examiner*—Hsien-ming Lee
(74) *Attorney, Agent, or Firm*—Moser IP Law Group

(57) ABSTRACT

Methods of processing a substrate are provided herein. In some embodiments, a method of processing a substrate may include providing a substrate to a process chamber comprising a dielectric layer having a feature formed therein. A barrier layer may be formed within the feature. A coating of a first conductive material may be formed atop the barrier layer. A seed layer of the first conductive material may be formed atop the coating. The feature may be filled with a second conductive material. In some embodiments, the seed layer may be formed while maintaining the substrate at a temperature of greater than about 40 degrees Celsius.

23 Claims, 4 Drawing Sheets

METHODS FOR REDUCING DAMAGE TO SUBSTRATE LAYERS IN DEPOSITION PROCESSES

BACKGROUND

1. Field

The present invention generally relates to the processing of semiconductor substrates, and more particularly, to methods for reducing damage to substrate layers during deposition processes.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components. As the dimensions decrease, processing of the integrated chip substrates become increasingly more challenging.

For example, in conventional substrate processing, thin layers of material are applied to the inner surfaces of substrate features prior to filling the feature with conductive material. Ideally, the thin layer would be consistent throughout the feature, while minimizing overhang (excessive material on surfaces of the opening of the feature), which can reduce the size of the feature opening, or close the opening completely (undesirably leaving an air gap trapped within the feature). As the dimensions of the integrated circuit components decrease, the aspect ratio of the height of the feature to the width of the feature increases.

Typical processes commonly used for fabricating integrated circuits having such high aspect ratio features include depositing material in a bottom of the features and re-sputtering the material to facilitate redistribution from the bottom to the sidewalls of the feature. This is done using high energy ions directed toward the substrate. Unfortunately, this method may cause damage to the underlying layers and the substrate itself, particularly at the corners, or bevel, and bottom of the feature. This damage results in significant line resistance increase and reliability degradation.

Therefore, there is a need in the art for improved methods for forming thin layers of material to the inner surfaces of high aspect ratio features.

SUMMARY

Methods of processing a substrate are provided herein. In some embodiments, a method of processing a substrate may include providing a substrate to a process chamber comprising a dielectric layer having a feature formed therein. A barrier layer may be formed within the feature. A coating of a first conductive material may be formed atop the barrier layer. A seed layer of the first conductive material may be formed atop the coating. The feature may be filled with a second conductive material. In some embodiments, the seed layer may be formed while maintaining the substrate at a temperature of greater than about 40 degrees Celsius.

In some embodiments, a method of processing a substrate may include providing a substrate comprising an exposed dielectric layer having a feature formed therein; forming a barrier layer within the feature; depositing a seed layer of a first conductive material atop the coating while maintaining the substrate at a temperature of greater than about 40 degrees Celsius; and filling the feature with a second conductive material.

In some embodiments, a method for processing semiconductor substrates includes a computer readable medium, having instructions stored thereon which, when executed by a controller, causes a process chamber having a substrate disposed therein to perform a process, wherein the substrate comprises a dielectric layer having a feature formed therein. A barrier layer may be formed within the feature. A coating of a first conductive material may be formed atop the barrier layer. A seed layer of the first conductive material may be formed atop the coating. The feature may be filled with a second conductive material. In some embodiments, the seed layer may be formed while maintaining the substrate at a temperature of greater than about 40 degrees Celsius.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to methods for processing substrates. The inventive methods include methods for forming barrier layers for use in, for example, vertical interconnect structures. The inventive methods may advantageously reduce damage to substrate layers, thereby reducing line resistivity and opportunity for electromigration, thus increasing the reliability of the finished devices.

Figure 1:
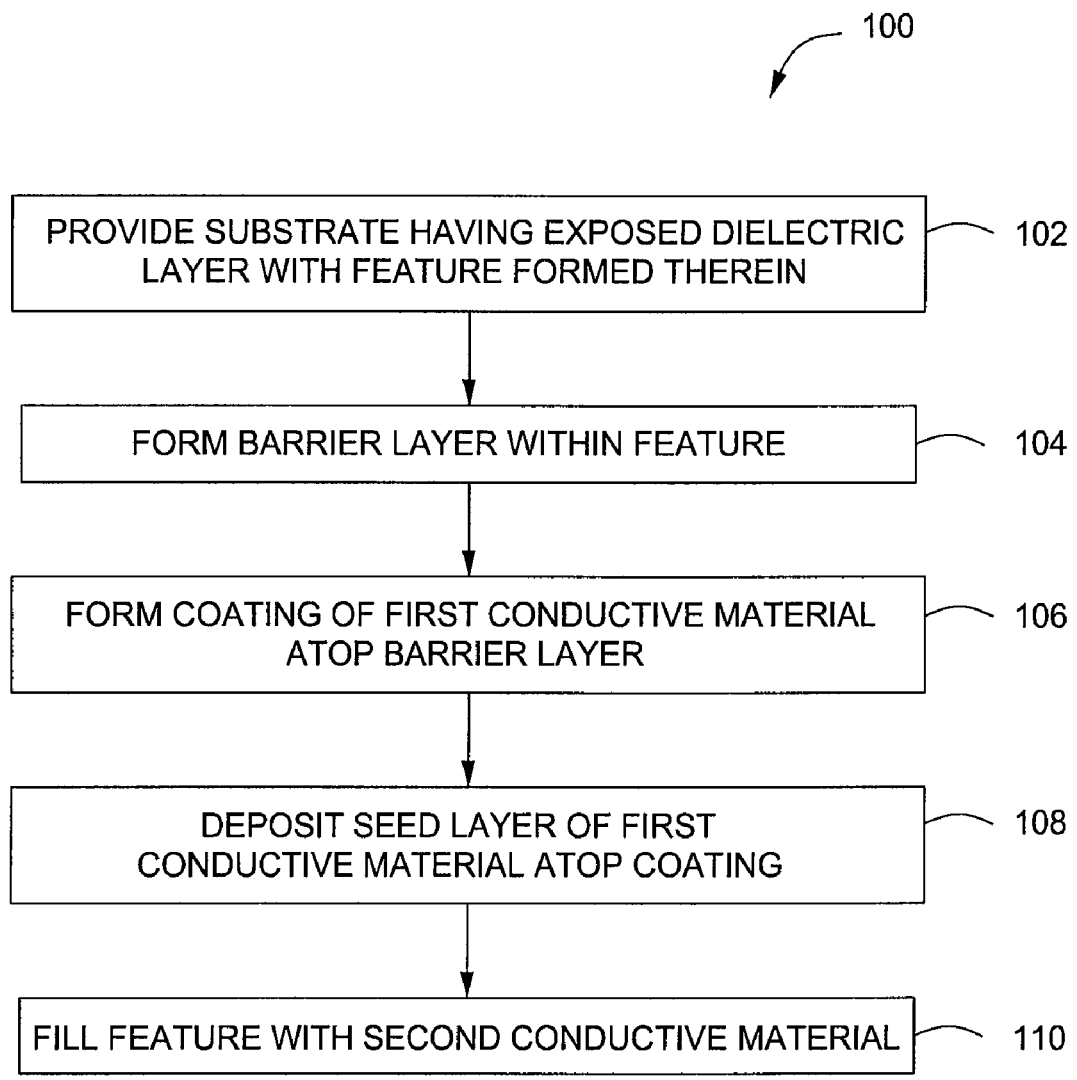
FIG. 1 depicts a method for the processing of a semiconductor substrate in accordance with some embodiments of the present invention.
Figure 2A:
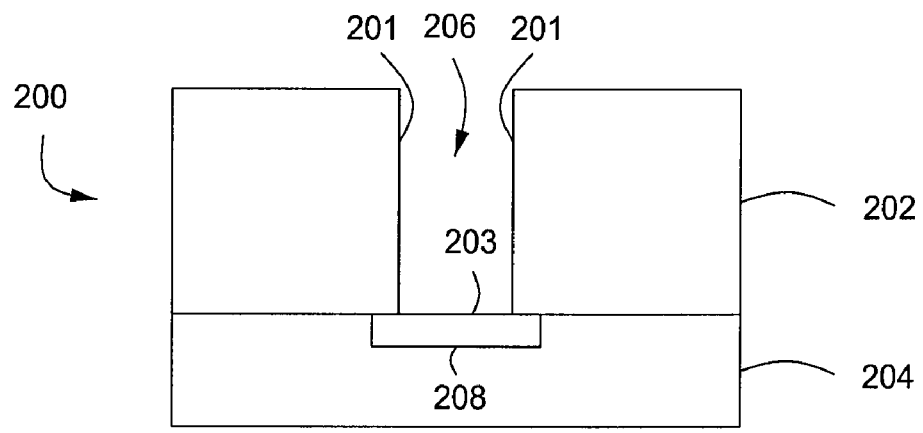
FIGS. 2A-2E are illustrative cross-sectional views of a substrate during different stages of the processing sequence in accordance with some embodiments of the present invention.
Figure 2B:
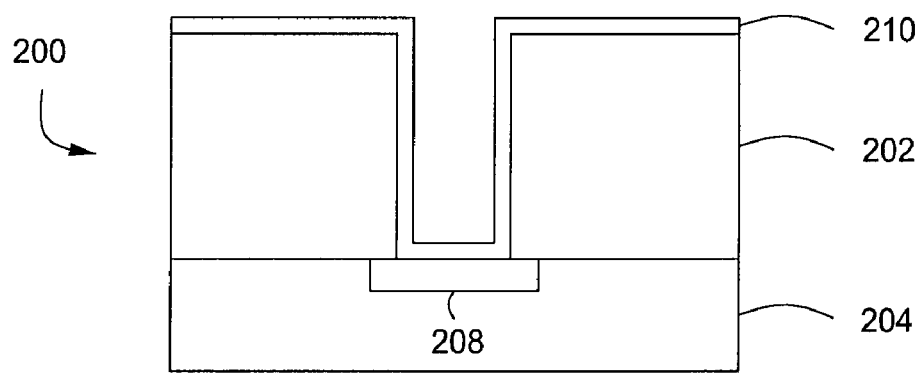
Figure 2C:
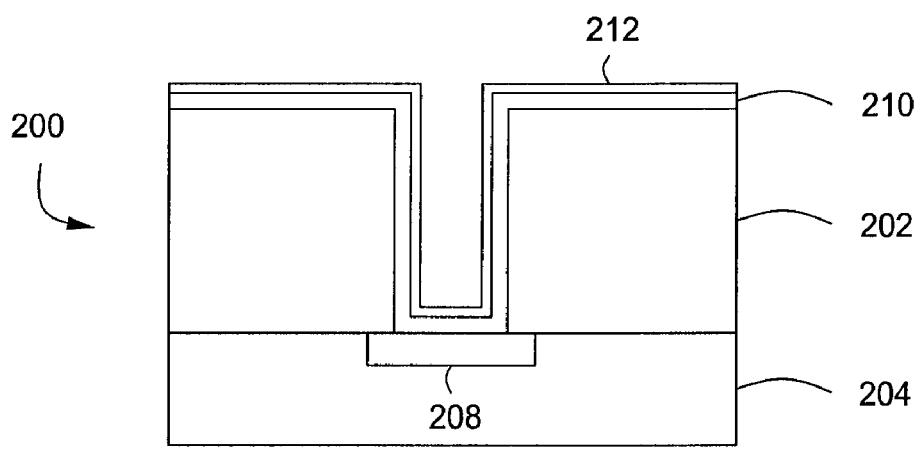
Figure 2D:
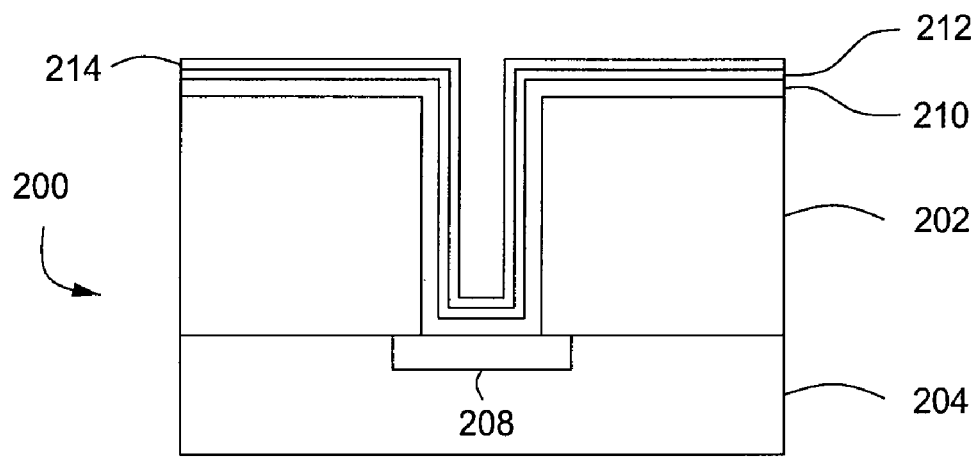
Figure 2E:
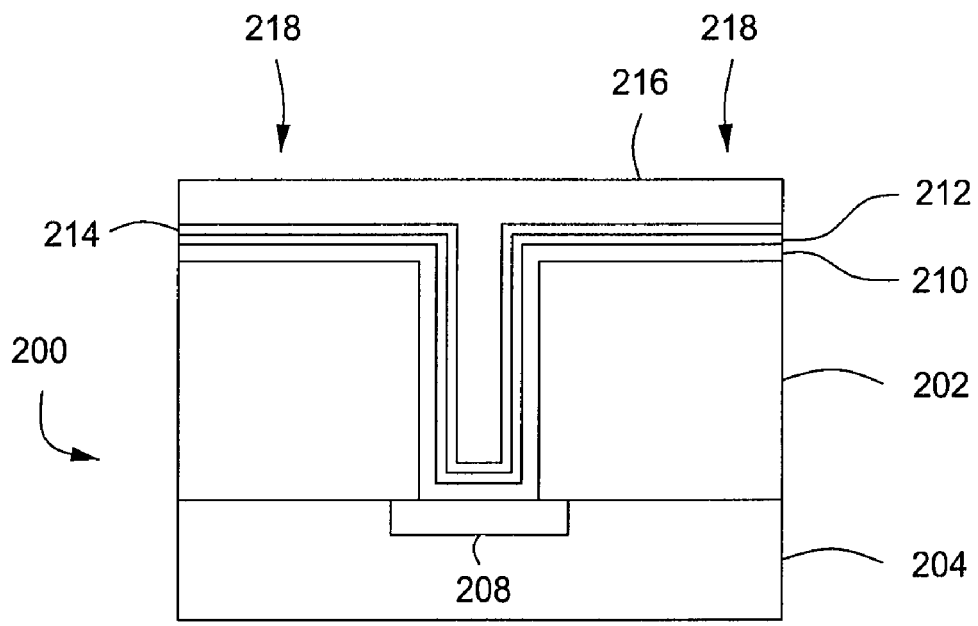

FIG. 1 depicts a method for the processing of a semiconductor substrate in accordance with some embodiments of the present invention. FIGS. 2A-2E are illustrative cross-sectional views of a substrate during different stages of the processing sequence in accordance with some embodiments of the present invention. The above method may be performed in any apparatus suitable for processing semiconductor substrates in accordance with embodiments of the present invention, such as discussed below with respect to FIG. 3.

The method 100 begins at 102, where a substrate 200 is provided having an exposed dielectric layer 202 with a feature 206 formed therein. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the dielectric layer 202 may be formed over a dielectric layer 204. A conductive feature 208 may be formed in an upper region of the dielectric layer 204 such that an upper surface of the conductive feature 208 may be exposed by the feature 206 formed in the dielectric layer 202. The conductive feature 208 may be fabricated from any suitable conductive material. For example, for a copper interconnect, the conductive feature 208 may be a copper layer embedded in the dielectric layer 204.

The dielectric layer 202 and the dielectric layer 204 may be fabricated from the same or different materials. In some embodiments, the dielectric materials may comprise silicon oxide ($SiO_2$), silicon nitride (SiN), a low-K material, or the like. The low-k material may be a carbon-doped dielectric material, such as carbon-doped silicon oxide (SiOC), organic polymers (such as polyimide, parylene), organic doped silicon glass (OSG), fluorine doped silicon glass (FSG), and the like. As used herein, low-k materials are materials having a dielectric constant less than about that of silicon oxide, which is about 3.9.

The feature 206 is generally defined by sidewalls 201 and bottom surfaces 203. For example, the feature 206 may be a via, a trench, a dual damascene feature, or the like, and may be formed through any suitable process such as an etch process. Although shown as a single feature, multiple features may be simultaneously processed in accordance with the teachings disclosed herein. Although the feature 206 may generally have any dimensions, in some embodiments, the feature 206 is a high aspect ratio feature. For example, in some embodiments, the feature may have a ratio of a height of the feature to a width of the feature of at least about 4, In some embodiments, the feature 206 may have a width of less than about 60 nm. The substrate 200 may also include different and/or additional material layers. In addition, other features, such as trenches, vias, or the like, may be formed in one or more layers of the substrate 200.

Next, at 104, a barrier layer 210 is formed within the feature 206 of the substrate 200. In some embodiments, the barrier layer 210 may comprise tantalum (Ta), tantalum nitride (TaN), ruthenium (Ru), ruthenium tantalum nitride (RuTaN), tungsten (W), tungsten nitride (WN), titanium (Ti), titanium nitride (TiN), silicon (Si), or the like. The barrier layer 210 may be formed by any suitable deposition process, such as chemical vapor deposition, physical vapor deposition, or the like. The barrier layer 210 is generally formed to a thickness that leaves room within the feature to fill the feature with a conductive material, as discussed below. In some embodiments, the barrier layer 210 may be formed to a thickness of between about 1 to about 20 nm.

Next, at 106, a coating 212 of a first conductive material may optionally be deposited atop the barrier layer 210. The coating 212 facilitates protecting the barrier layer 210 from a subsequent seed layer deposition step, as discussed below, and may be formed to a thickness of from a few atoms to up to about 40 nm. The coating 212 may comprise the same material as utilized for the subsequent seed layer deposition step, or may be a different material. In some embodiments, the subsequent deposition of the seed layer 214 may be suitably controlled, as discussed below, to make the coating 212 optional. In some embodiments, the first conductive material may comprise a metal or metal alloy different from a material comprising the barrier layer. In some embodiments, the first conductive material may comprise copper (Cu) or the like, or alloys thereof.

The coating 212 may be deposited via any suitable deposition process that does not damage the underlying barrier layer 210. In some embodiments, the coating 212 may be deposited via a low energy deposition process, such as by low energy physical deposition. For example, in some embodiments, the coating 212 may be formed in a PVD chamber, such as described below with respect to FIG. 3, having a target comprising the material for the coating (e.g., copper). A suitable gas, such as argon (Ar), may be provided to the chamber and directed towards the target to eject atoms of the target material, which are then directed towards the substrate 200 by applying a substrate bias. In some embodiments, to facilitate a low energy deposition of the coating 212 that does not damage the barrier layer 210 or the corners and/or bottom of the feature 206, a substrate bias having a frequency of between about 13 to about 60 MHz and a power density of between about 0.2 to about 0.5 Watts/$cm^2$ for a deposition rate of about 20 to 30 Å/second may be applied to the substrate support.

Next, at 108, a seed layer 214 of the first conductive material is deposited atop the coating 212. The seed layer 214 facilitates uniform growth and coverage of a subsequent metal fill step, as discussed below. As such, the seed layer 214 is deposited to provide sufficient coverage of the sidewalls of the feature 206, while having minimal overhang near the opening of the feature 206. For example, the seed layer 214 may be formed to a thickness of from a few atoms to up to about 50 nm of equivalent amount material deposited without substrate bias (e.g., the thickness that would be obtained if the material deposited on the bottom surface of the feature was not sputtered to the sidewalls of the feature).

In order to deposit a seed layer having sufficient sidewall coverage with minimal overhang, the seed layer 214 may be deposited within the feature 206 using a high energy deposition process, such as high energy physical vapor deposition. Such suitable high energy deposition processes may include, for example, a simultaneous seed layer deposition process that simultaneously deposits the seed layer while resputtering seed layer material from the bottom of the feature, by applying very high substrate bias, or by using a secondary RF plasma in combination with a high substrate bias, to deposit on the sidewalls of the feature. Alternatively, a seed layer deposition process may be followed by high energy argon re-sputter process to resputter the seed layer material from the bottom of the feature to the sidewalls.

In some embodiments, the temperature of the substrate support on which the substrate is seated may be maintained at an elevated temperature during the seed layer 214 deposition process. Maintaining the substrate support (and thus, the substrate) at an elevated temperature during the high energy resputter process facilitates providing increased mobility to the seed layer atoms (e.g., copper) deposited on the sidewalls of the feature 206 to quickly compensate for the depleted surface of the seed layer 214 due to the sputtering (e.g., the regions of the seed layer 214 where the atoms sputter from). Once the redistribution rate overcomes the sputtering rate, the attacked region is protected from sputtering damage. As such, the depleted surfaces of the seed layer 214 can be protected from excess resputtering which can cause damage. This facilitates a balance between sputtering and kinetic reflow processes. In some embodiments, the temperature of the substrate support may be greater than about room temperature, or between about 40 to about 200 degrees Celsius, or between about 40 to about 50 degrees Celsius. The temperature of the substrate may be greater than that of the substrate support during deposition processes due to the incoming materials being deposited on the substrate.

Next, at 110 the feature 206 is filled with a second conductive material 216 atop the seed layer 214. In some embodiments, the second conductive material may be copper, a copper alloy, or the like. The second conductive material 216 may or may not be the same material as the first conductive material. In some embodiments, the feature 206 may be filled with the second conductive material 216 via electrochemical deposition, or plating (ECP). The second conductive material 216 generally fills the feature 206 and covers the top of the field region 218. The seed layer 214 acts as both a plating electrode and a nucleation layer for the electroplating. After filling the feature 206 with the second conductive material 216, chemical mechanical polishing (CMP) may be used to remove the excess second conductive material 216 outside the feature 206 (and any other features, such as other via, trenches, dual damascene structures, or the like). Further metallization levels including additional dielectric layers and metallization structures may then be formed over the filled feature 206.

Although discussed above with respect to a metal interconnect fabrication process, the inventive methods may also be utilized in other applications as well. For example, the present techniques may provide for protection of other metal surfaces (e.g., the barrier layer 210 in the above example) from sputtering damage by coating such surfaces with a lower melting point metal (e.g., the coating 212 in the above example). The surface to be protected may be maintained at a relatively higher temperature, as discussed with respect to the deposition process for forming the seed layer 214. Consequently, the lower melting point metal may be reflowed back into depleted regions to facilitate maintaining the protective coating over the surface to be protected. The temperature increase of the substrate enhances mobility of the metal atoms being deposited on to the surface of the feature, and consequently increases the rate of metal atom redistribution into the region where the directly deposited metal atoms are depleted due to energetic ion sputtering. Once the redistribution rate overcomes the sputtering rate, the attacked region is protected from sputtering damage.

Figure 3:
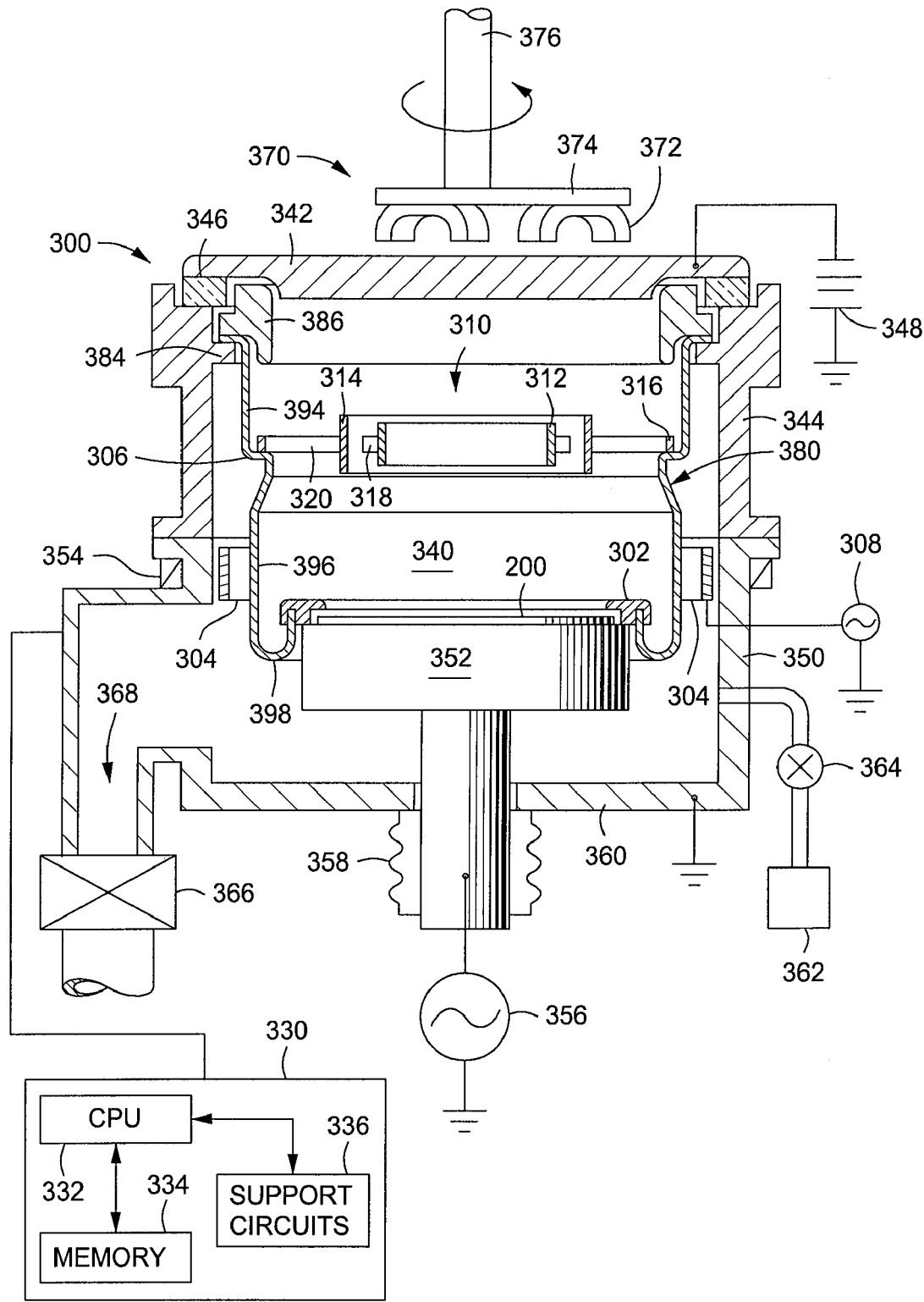
FIG. 3 depicts an apparatus suitable for processing semiconductor substrates in accordance with some embodiments of the present invention.

The inventive methods described herein may be performed in a physical vapor deposition chamber as described below. FIG. 3 illustrates one embodiment of a physical vapor deposition chamber (processing chamber 300) in which the invention may be practiced. An example of a suitable PVD chamber is the SIP ENCORE® PVD processing chamber, commercially available from Applied Materials, Inc., of Santa Clara, Calif. It is contemplated that other processing chambers from other manufactures may also be utilized to perform the present invention.

In some embodiments, the processing chamber 300 contains a substrate support pedestal 352 for receiving the substrate 200 thereon, and a sputtering source, such as a target 342. The substrate support pedestal 352 may be located within a grounded enclosure wall 350, which may be a chamber wall (as shown) or a grounded shield (not shown). The substrate support pedestal 352 may include any suitable means (not shown) of providing heat to the substrate 200, for example, such as a resistive heating element, radiant cavity and light source, or the like.

The target 342 may be supported on a grounded conductive aluminum adapter 344 through a dielectric isolator 346. The target 342 comprises a material to be deposited on the substrate 200 during sputtering, such as titanium when depositing a titanium nitride film in accordance with embodiments of the present invention.

The substrate support pedestal 352 has a material-receiving surface facing the principal surface of the target 342 and supports the substrate 200 to be sputter coated in planar position opposite to the principal surface of the target 342. The substrate support pedestal 352 may support the substrate 200 in a central region 340 of the processing chamber 300. The central region 340 is defined as the region above the substrate support pedestal 352 during processing (for example, between the target 342 and the substrate support pedestal 352 when in a processing position).

The substrate support pedestal 352 is vertically movable through a bellows 358 connected to a bottom chamber wall 360 to allow the substrate 200 to be transferred onto the substrate support pedestal 352 through a load lock valve (not shown) in the lower portion of processing the chamber 300 and thereafter raised to a deposition, or processing position as depicted in FIG. 3. One or more processing gases may be supplied from a gas source 362 through a mass flow controller 364 into the lower part of the chamber 300. An exhaust port 368 may be provided and coupled to a pump (not shown) via a valve 366 for exhausting the interior of the processing chamber 300 and facilitating maintaining a desired pressure inside the processing chamber 300.

A controllable DC power source 348 may be coupled to the chamber 300 to apply a negative voltage, or bias, to the target 342. An RF power supply 356 may be coupled to the substrate support pedestal 352 in order to induce a negative DC bias on the substrate 200. In addition, in some embodiments, a negative DC self-bias may form on the substrate 200 during processing. In other applications, the substrate support pedestal 352 may be grounded or left electrically floating.

A rotatable magnetron 370 may be positioned proximate a back surface of the target 342. The magnetron 370 includes a plurality of magnets 372 supported by a base plate 374. The base plate 374 connects to a rotation shaft 376 coincident with the central axis of the chamber 300 and the substrate 200. The magnets 372 produce a magnetic field within the chamber 300, generally parallel and close to the surface of the target 342 to trap electrons and increase the local plasma density, which in turn increases the sputtering rate. The magnets 372 produce an electromagnetic field around the top of the chamber 300, and magnets 372 are rotated to rotate the electromagnetic field which influences the plasma density of the process to more uniformly sputter the target 342.

The chamber 300 further includes a grounded bottom shield 380 connected to a ledge 384 of the adapter 344. A dark space shield 386 is supported on the bottom shield 380 and is fastened to the shield 380 by screws or other suitable manner. The metallic threaded connection between the bottom shield 380 and the dark space shield 386 allows the two shields 380, 386 to be grounded to the adapter 344. The adapter 344 in turn is sealed and grounded to the aluminum chamber sidewall 350. Both shields 380, 386 are typically formed from hard, non-magnetic stainless steel.

The bottom shield 380 extends downwardly in an upper tubular portion 394 of a first diameter and a lower tubular portion 396 of a second diameter. The bottom shield 380 extends along the walls of the adapter 344 and the chamber wall 350 downwardly to below a top surface of the substrate support pedestal 352 and returns upwardly until reaching a top surface of the substrate support pedestal 352 (e.g., forming a u-shaped portion 398 at the bottom). A cover ring 302 rests on the top of the upwardly extending inner portion of the bottom shield 380 when the substrate support pedestal 352 is in its lower, loading position but rests on the outer periphery of the substrate support pedestal 352 when it is in its upper, deposition position to protect the substrate support pedestal 352 from sputter deposition. An additional deposition ring (not shown) may be used to shield the periphery of the substrate 200 from deposition.

An RF coil 304 may be disposed just outside the periphery of the substrate 200 in a lower half or third of the space between the target 342 and the substrate support pedestal 352. Multiple insulating supports (not shown) in the bottom shield 380 support the RF coil 304 and also supply RF power and grounding to the RF coil 304. The coil 304 may be a single-turn, nearly tubular coil composed of copper and having a small gap between the closely spaced electrical leads for power and grounding. An RF power supply 308 may be provided to supply RF power to the RF coil 304 to generate an argon plasma in a region removed from the target 342. Generally, the target 342 may be DC powered for sputter deposition and the RF coil 304 may be utilized for sputter etching of the substrate 200. However, in some embodiments, an RF supply may power the target sputtering process.

The chamber 300 may also be adapted to provide a more directional sputtering of material onto a substrate. In one embodiment, directional sputtering may be achieved by positioning a collimator 310 between the target 342 and the substrate support pedestal 352 to provide a more uniform and symmetrical flux of deposition material to the substrate 200.

The collimator 310 may rest on the ledge portion of the bottom shield 380, thereby grounding the collimator 310. The collimator 310 may be a metal ring and may include an outer tubular section and at least one inner concentric tubular section, for example, three concentric tubular sections 312, 314, 316 linked by cross struts 320, 318. The outer tubular section 316 rests on the ledge portion 306 of the bottom shield 380. The use of the bottom shield 380 to support the collimator 310 simplifies the design and maintenance of the chamber 300. At least the two inner tubular sections 312, 314 are of sufficient height to define high aspect ratio apertures that partially collimate the sputtered particles. Further, the upper surface of the collimator 310 acts as a ground plane in opposition to the biased target 342, which facilitates keeping plasma electrons away from the substrate 200.

In some embodiments, a magnet 354 may be disposed about the chamber 300 for selectively providing a magnetic field between the substrate support pedestal 352 and the target 342. For example, as shown in FIG. 3, the magnet 354 may be disposed about the outside of the chamber wall 350 in a region just above the substrate support pedestal 352 when in processing position. The magnet 354 may be an electromagnet and may be coupled to a power source (not shown) for controlling the magnitude of the magnetic field generated by the electromagnet.

A controller 330 is coupled to various components of the process chamber 300 for controlling the operation thereof and comprises a central processing unit (CPU) 332, a memory 334, and support circuits 336 for the CPU 332. The controller 330 may control the substrate processing apparatus directly, or via computers (or controllers) associated with particular process chamber and/or the support system components. The controller 330 may be one of any form of general-purpose computer processor that can be used in an industrial setting for controlling various chambers and sub-processors. The memory, or computer-readable medium, 334 of the CPU 332 may be one or more of readily available memory such as random access memory (RAM), read only memory (ROM), floppy disk, hard disk, flash, or any other form of digital storage, local or remote. The support circuits 336 are coupled to the CPU 332 for supporting the processor in a conventional manner. These circuits include cache, power supplies, clock circuits, input/output circuitry and subsystems, and the like.

Inventive methods as described herein may be stored in the memory 334 as software routine that may be executed or invoked to control the operation of the process chamber 300 in the manner described herein. The software routine may also be stored and/or executed by a second CPU (not shown) that is remotely located from the hardware being controlled by the CPU 332.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
providing a substrate comprising a dielectric layer having a feature formed therein;
forming a barrier layer within the feature;
forming a coating of a first conductive material atop the barrier layer, wherein the coating is formed by a low energy physical vapor deposition process;
depositing a seed layer of the first conductive material atop the coating; and
depositing a second conductive material atop the seed layer to fill the feature.

2. The method of claim 1, wherein the barrier layer further comprises at least one of tantalum (Ta), ruthenium (Ru), tantalum nitride (TaN), ruthenium tantalum nitride (RuTaN), tungsten (W), tungsten nitride (WN), titanium (Ti), titanium nitride (TiN) or silicon (Si).

3. The method of claim 1, wherein forming the coating comprises:
sputtering the coating material into the feature while providing a substrate bias of less than about 0.5 W/cm$^2$.

4. The method of claim 1, wherein depositing the seed layer comprises:
depositing the seed layer by a high energy physical vapor deposition process.

5. The method of claim 4, wherein depositing the seed layer further comprises:
sputtering the deposited seed layer material onto sidewalls of the feature.

6. The method of claim 5, wherein sputtering the deposited seed layer material further comprises:
providing increased mobility to the seed layer material deposited on the sidewalls of the feature, thereby increasing the rate of metal atom redistribution.

7. The method of claim 6, wherein sputtering the deposited seed layer material further comprises:
maintaining the substrate at a temperature of greater than about 40 degrees Celsius.

8. The method of claim 1, wherein the first conductive material comprises a metal or metal alloy different from a material comprising the barrier layer.

9. The method of claim 1, wherein the second conductive material comprises copper (Cu) or alloys thereof.

10. The method of claim 1, wherein the feature is filled by the second conductive material via electrochemical deposition.

11. A method of processing a substrate, comprising:
providing a substrate comprising an exposed dielectric layer having a feature formed therein;
forming a barrier layer within the feature;
depositing a seed layer of a first conductive material atop the barrier layer while maintaining the substrate at a temperature of greater than about 40 degrees Celsius, wherein the seed layer is deposited by a high energy physical vapor deposition process; and depositing a second conductive material atop the seed layer to fill the feature.

12. The method of claim 11, wherein the barrier layer further comprises at least one tantalum (Ta), ruthenium (Ru), tantalum nitride (TaN), ruthenium tantalum nitride (RuTaN), tungsten (W), tungsten nitride (WN), titanium (Ti), titanium nitride (TiN) or silicon (Si).

13. The method of claim 11, wherein depositing the seed layer further comprises:
sputtering the deposited seed layer material onto sidewalls within the feature.

14. The method of claim 11, wherein the first conductive material comprises a metal or metal alloy different from a material comprising the barrier layer.

15. The method of claim 11, wherein the second conductive material comprises copper (Cu) or alloys thereof.

16. A computer readable medium, having instructions stored thereon which, when executed by a controller, causes a process chamber having a substrate disposed therein to perform a method, wherein the substrate comprises a dielectric layer having a feature formed therein, the method comprising:
forming a barrier layer within the feature;
forming a coating of a first conductive material atop the barrier layer, wherein the coating is formed by a low energy physical vapor deposition process;
depositing a seed layer of the first conductive material atop the coating; and
depositing a second conductive material atop the seed layer to fill the feature.

17. The computer readable medium of claim 16, wherein the barrier layer further comprises at least one of tantalum (Ta), ruthenium (Ru), tantalum nitride (TaN), ruthenium tantalum nitride (RuTaN), tungsten (W), tungsten nitride (WN), titanium (Ti), titanium nitride (TiN) or silicon (Si).

18. The computer readable medium of claim 16, wherein forming the coating comprises:
sputtering the coating material into the feature while providing a substrate bias of less than about 0.5 W/cm$^2$.

19. The computer readable medium of claim 18, wherein depositing the seed layer further comprises:
sputtering the deposited seed layer material onto sidewalls of the feature.

20. The computer readable medium of claim 16, wherein depositing the seed layer comprises:
depositing the seed layer by a high energy chemical vapor deposition or physical vapor deposition process.

21. The computer readable medium of claim 20, wherein sputtering the deposited seed layer material further comprises:
maintaining the substrate at a temperature of greater than about 40 degrees Celsius.

22. The computer readable medium of claim 16, wherein the first and second conductive materials comprise at least one of copper (Cu) or a copper alloy.

23. A computer readable medium having instructions stored thereon which, when executed by a controller, causes a process chamber having a substrate disposed therein to perform a method, wherein the substrate comprises a dielectric layer having a feature formed therein, the method comprising:
forming a barrier layer within the feature;
depositing a seed layer of a first conductive material atop the barrier layer while maintaining the substrate at a temperature of greater than about 40 degrees Celsius, wherein the seed layer is deposited by a high energy physical vapor deposition process; and
depositing a second conductive material atop the seed layer to fill the feature.

* * * * *